(12) United States Patent
Lee et al.

(10) Patent No.: US 9,817,190 B2
(45) Date of Patent: Nov. 14, 2017

(54) TUNABLE WAVELENGTH FILTER WITH EMBEDDED METAL TEMPERATURE SENSOR AND ITS APPLICATION TO EXTERNAL-CAVITY TYPE TUNABLE WAVELENGTH LASER

(71) Applicants: ChemOptics Inc., Daejeon (KR); Solidsystems Inc., Yongin-si, Gyeonggi-do (KR)

(72) Inventors: Hak Kyu Lee, Seoul (KR); Jun Kyu Seo, Daejeon (KR); Woo Jin Lee, Yongin-si (KR); Kyoung Min Kim, Seoul (KR)

(73) Assignees: ChemOptics Inc., Daejeon (KR); Solidsystems Inc., Yongin-si (KR)

( * ) Notice: Subject to any disclaimer, the term of this patent is extended or adjusted under 35 U.S.C. 154(b) by 424 days.

(21) Appl. No.: 14/523,665

(22) Filed: Oct. 24, 2014

(65) Prior Publication Data
US 2015/0117491 A1    Apr. 30, 2015

(30) Foreign Application Priority Data

Oct. 24, 2013  (KR) .................. 10-2013-0127282
Oct. 16, 2014  (KR) .................. 10-2014-0139725

(51) Int. Cl.
*G02B 6/00*      (2006.01)
*G02B 6/293*     (2006.01)
(Continued)

(52) U.S. Cl.
CPC .......... *G02B 6/29322* (2013.01); *G01K 1/14* (2013.01); *G01K 7/16* (2013.01); *G01K 13/00* (2013.01);
(Continued)

(58) Field of Classification Search
CPC ............ G02B 6/29322; G02B 6/02204; G02B 6/4271; G01K 1/14; G01K 7/16;
(Continued)

(56) References Cited

U.S. PATENT DOCUMENTS 6,303,040 B1   10/2001  Oh et al.
8,615,025 B2 * 12/2013  Dallesasse .............. H01S 5/021
                                                          372/20
(Continued)

FOREIGN PATENT DOCUMENTS

CN      1659752 A    8/2005
CN    101001001 A    7/2007
(Continued)

*Primary Examiner* — Armando Rodriguez
(74) *Attorney, Agent, or Firm* — McCoy Russell LLP

(57) ABSTRACT

Provided are a tunable wavelength filter with an embedded metal temperature sensor and an external-cavity type tunable wavelength laser module. In detail, the tunable wavelength filter with an embedded metal temperature sensor and the external-cavity type tunable wavelength laser module achieve wavelength stability by forming a metal temperature sensor using a resistance change of a metal thin film according to temperature on a point on an isothermal layer having the same temperature distribution as the optical waveguide during a process for fabricating the optical waveguide with polymer to accurately measure a temperature of an optical waveguide.

12 Claims, 4 Drawing Sheets

(51) Int. Cl.
  *G01K 7/16* (2006.01)
  *G01K 13/00* (2006.01)
  *G01K 1/14* (2006.01)
  *H01S 5/024* (2006.01)
  *H01S 5/14* (2006.01)
  *G02B 6/42* (2006.01)
  *G02B 6/02* (2006.01)
  *H01S 3/1055* (2006.01)
  *H01S 3/106* (2006.01)
  *H01S 5/022* (2006.01)
  *H01S 5/06* (2006.01)

(52) U.S. Cl.
  CPC .......... *H01S 5/02446* (2013.01); *H01S 5/141*
    (2013.01); *G02B 6/02204* (2013.01); *G02B 6/4271* (2013.01); *H01S 3/106* (2013.01); *H01S 3/1055* (2013.01); *H01S 5/02248* (2013.01); *H01S 5/0612* (2013.01)

(58) Field of Classification Search
  CPC ..... G01K 13/00; H01S 5/02446; H01S 5/141; H01S 5/02248; H01S 5/0612; H01S 3/1055; H01S 3/106
  See application file for complete search history.

(56) References Cited

U.S. PATENT DOCUMENTS

2011/0090932 A1    4/2011  Park et al.
2012/0099611 A1*   4/2012  Kim ........................ H01S 5/141
                                                    372/20

FOREIGN PATENT DOCUMENTS

| CN | 101350496 A | 1/2009 |
| CN | 101652941 A | 2/2010 |
| JP | 09092934 A | 4/1997 |
| JP | 2010197627 A | 9/2010 |
| KR | 1020100133797 A | 12/2010 |
| KR | 1020120064507 A | 6/2012 |

* cited by examiner

TUNABLE WAVELENGTH FILTER WITH EMBEDDED METAL TEMPERATURE SENSOR AND ITS APPLICATION TO EXTERNAL-CAVITY TYPE TUNABLE WAVELENGTH LASER

CROSS-REFERENCE TO RELATED APPLICATIONS

This application claims priority under 35 U.S.C. §119 to Korean Patent Application Nos. 10-2013-0127282, filed on Oct. 24, 2013 and 10-2014-0139725, filed on Oct. 16, 2014, in the Korean Intellectual Property Office, the invention of which is incorporated herein by reference in its entirety.

TECHNICAL FIELD

The following disclosure relates to a tunable wavelength filter with an embedded metal temperature sensor and an external-cavity type tunable wavelength laser module. More particularly, the following disclosure relates to a tunable wavelength filter with an embedded metal temperature sensor and an external-cavity type tunable wavelength laser module achieve wavelength stability by forming a metal temperature sensor using a resistance change of a metal thin film according to temperature on a point on an isothermal layer having the same temperature distribution as the optical waveguide during a process for fabricating the optical waveguide with polymer to accurately measure a temperature of an optical waveguide.

BACKGROUND

A wavelength division multiplexing (WDM) optical communication technology is one of the technologies that have been currently and mostly applied to backbone network and metro network and refers to a technology for performing wavelength division multiplexing (WDM) on an optical line including optical fibers and transmitting a plurality of high speed signals. A WDM transport network requires an optical add/drop multiplexer (OADM) function of selectively branching/combining some wavelengths without photoelectric conversion and passing other some wavelengths. OADM may connect intermediate nodes present on a transmission line in wavelength units, thereby expanding network connectivity and enhancing efficiency. Reconfigured OADM (ROADM) is advantageous in that branched/combined wavelengths may be reconfigured at a remote place and a wavelength connection state of an entire network may be effectively reconfigured without an expert so as to flexibly handle a change in traffic state, thereby remarkably reducing network maintenance costs.

ROADM is largely classified and used into a switch based structure and a broadcast and select (BS) type structure. Recently, a method using the latter is more advantageous to accommodate a plurality of nodes in respect to low path loss and thus is more preferred in a system. The BS type ROADM system is a main component for configuring a system by a light distributor, a wavelength multiplexer/demultiplexer, a variable optical attenuator (VOA), a tunable wavelength filter, and a tunable wavelength laser. In particular, a tunable transponder configured by integrating a tunable wavelength laser and a tunable wavelength filter provides a function of varying a wavelength at a remote plate and reconfiguring a network, and thus a stock burden of back-up optical components is reduced for a network operator to reduce time for network management and a random wavelength may be added/dropped for selection of wavelength to be added/dropped to effectively handle a change in traffic state. Accordingly, the tunable transponder is the most effective ROADM technology for reducing maintenance costs.

However, since the tunable wavelength filter technology is not enhanced and a tunable wavelength laser is very expensive, there are impediments to developing a tunable wavelength transponder.

With regard to a tunable wavelength filter, although an optical fiber Bragg grating-based filter has been currently developed, tunable wavelength response time is 5 seconds, which is very long and the price of the filter is also high, and thus, use of the tunable wavelength filter for a commercial system is low.

With regard to a tunable wavelength laser, although a laser using a distributed feedback (DFB) structure has also been developed and used, a tunable wavelength has a narrow range of 10 nm or less, and thus, the tunable wavelength laser is disadvantageous to use three to four sets of tunable wavelength DFB laser modules in order to support all wavelengths within a C-band (1535 nm to 1565 nm). In addition, a tunable wavelength transponder using a DFB laser uses an expensive light source and a multichannel transponder needs to be prepared for back-up. Thus, the tunable wavelength transponder is not an effective solution for reducing a stock burden to a network operator.

Accordingly, in order to embody effective and economical tunable wavelength transponder for a ROADM system, there is a need to develop an external-cavity type tunable wavelength light source using a tunable wavelength filter for varying all required wavelengths of a WDM band (e.g., C-band) by one module and a tunable wavelength filter providing a wideband tunable wavelength function.

Examples of the tunable wavelength filter technology include a tunable Fabry-Perot filter, a micro machined device, a Mach-Zehnder interferometer, fiber Bragg gratings, acousto-optic tunable filters, electro-optic tunable filters, arrayed waveguide grating (AWG), an active filter, ring resonator tunable filters, etc.

An optical waveguide type polymer tunable wavelength filter technology using Bragg gratings is disclosed in U.S. Pat. No. 6,303,040 (registered on Oct. 16, 2001, Title: Method of fabricating thermo optic tunable wavelength filter).

A conventional technology for a polymer optical waveguide type tunable wavelength filter refers to a technology for changing a refractive index of a medium using a thermo-optic effect and optionally reflecting or passing required specific wavelength of light and uses a heating element 13 (in general, a metallic thin film) for locally generating heat at an upper end of a polymer optical waveguide 12 in order to change an effective refractive index of the polymer optical waveguide 12 to vary an operating wavelength of a filter (refer to FIG. 5).

However, the conventional technology using a metallic heating element is disadvantageous in that a constant filter operating wavelength is not always provided regardless of an external environment because a relationship between a heating value generated from the metallic heating element and a required filter operating wavelength is changed according to an external environment when an external temperature changes.

Accordingly, a configuration for compensating for a temperature according to a change from the external environment needs to be used.

However, in general, a thermistor 11 as a general chip for measuring a temperature needs to be positioned on a surface of a wafer or next to the wafer that is spaced from a waveguide through which light passes due to the characteristics of the thermistor 11. Accordingly, a temperature change between the thermistor 11 and the waveguide that actually experiences temperature change occurs.

In this case, a temperature difference between a thermistor and a waveguide that directly experiences a temperature change that affects a laser wavelength may seriously and adversely affect the stability of a wavelength.

CITED REFERENCE

Patent Document

U.S. Pat. No. 6,303,040 (registered on Oct. 16, 2001, Title: Method of fabricating thermo optic tunable wavelength filter)

SUMMARY

An embodiment of the present invention is directed to providing a tunable wavelength filter with an embedded metal temperature sensor for achieving wavelength stability by forming a metal temperature sensor using a resistance change of a metal thin film according to temperature at a point on an isothermal layer having the same temperature distribution as the optical waveguide during a process for fabricating the optical waveguide made with polymer to accurately measure a temperature of an optical waveguide.

Another embodiment of the present invention is directed to providing an external-cavity type tunable wavelength laser module for achieving high productivity during mass production and thermal, electrical, and mechanical stability using a tunable wavelength filter with an embedded metal temperature sensor.

In one general aspect, a tunable wavelength filter with an embedded metal temperature sensor includes an optical waveguide, one or more Bragg gratings formed on the optical waveguide, a tunable wavelength thin film heater formed on the optical waveguide including the Bragg gratings, a thin film heater for phase adjustment formed on the optical waveguide and formed to be spaced apart from the Bragg gratings in a length direction by a predetermined distance, a metal temperature sensor formed on the optical waveguide and formed to be spaced apart from the tunable wavelength thin film heater in a width direction by a predetermined distance, and a thermoelectric cooler disposed on a lower surface of a substrate on which the optical waveguide and the Bragg gratings are formed.

A reflective band of the Bragg gratings may be adjusted regardless of the external environment based on a temperature measured by the metal temperature sensor.

The metal temperature sensor may be positioned on an isothermal layer having the same temperature distribution as a core of the optical waveguide.

In this case, the metal temperature sensor may be formed at each of the opposite sides of the tunable wavelength thin film heater in a width direction, and the metal temperature sensor may be fabricated of the same metal as the tunable wavelength thin film heater.

The metal temperature sensor may be fabricated using the same process as the tunable wavelength thin film heater during a fabricating process of the tunable wavelength thin film heater.

In addition, an external-cavity type tunable wavelength laser module according to the present invention may be formed to include the tunable wavelength filter with the embedded metal temperature sensor, and the tunable wavelength laser module may continuously vary a wavelength.

Other features and aspects will be apparent from the following detailed description, the drawings, and the claims.

[Detailed Description of Main Elements]

Figure 1:
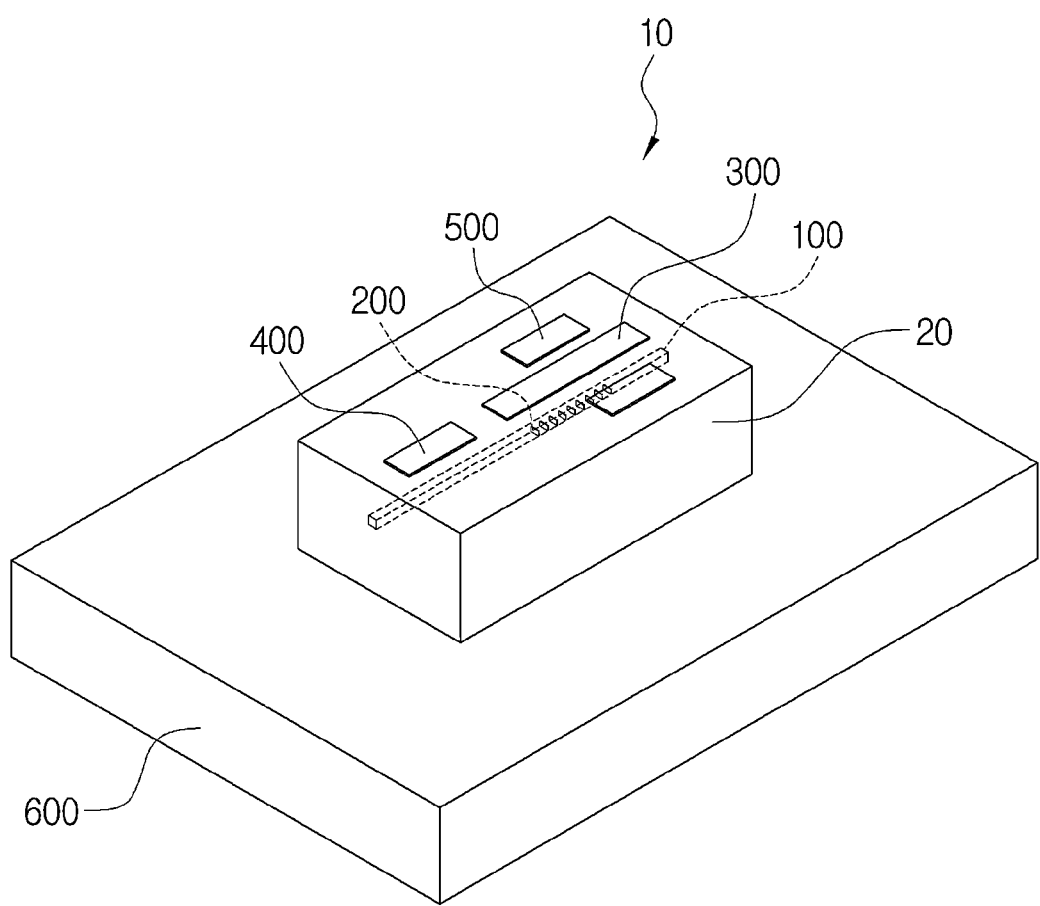
FIG. 1 is a perspective view of a tunable wavelength filter 10 with an embedded metal temperature sensor according to the present invention.

1: external-cavity type tunable wavelength laser module
10: tunable wavelength filter with embedded metal temperature sensor
20: substrate
100: optical waveguide
110: upper clad             120: lower clad
200: Bragg gratings
300: tunable wavelength thin film heater
400: thin film heater for phase adjustment
500: metal temperature sensor
600: thermoelectric cooler
700: semiconductor laser chip
800: chip stem

DETAILED DESCRIPTION OF EMBODIMENTS

Hereinafter, exemplary embodiments will be described in detail with reference to the accompanying drawings.

The accompanying drawings are for the purpose of describing particular embodiments only and are not intended to limit the present invention.

FIG. 1 illustrates a tunable wavelength filter 10 with an embedded metal temperature sensor. As shown in FIG. 1, the tunable wavelength filter 10 with the embedded metal temperature sensor according to an embodiment of the present invention includes an optical waveguide 100, Bragg gratings 200, a tunable wavelength thin film heater 300, a thin film heater 400 for phase adjustment, a metal temperature sensor 500, and a thermoelectric cooler 600.

The optical waveguide 100 may be generally a path for concentrating and inputting light output from a light source and may include an upper clad 110 for guiding total internal reflection, a lower clad 120, and a core 130 (refer to FIG. 3) in which light is transmitted.

In this case, since light concentrated by an optical lens is input to the core 130, a focus of a lens surface facing the optical waveguide 100 may be positioned on an input surface of the core 130, on which light is indicated by the lens, in a module state including a laser.

The optical waveguide 100 may be disposed on a substrate 20 for physical support, and the substrate 20 may be a silicon substrate 20, a polymer plate, a glass plate, or the like.

The Bragg gratings 200 may be formed on the optical waveguide 100 and a wavelength of light incident on the optical waveguide 100 may be changed according to an external condition change such as a temperature or intensity.

In the present invention, as well as the optical waveguide 100, the Bragg gratings 200 may also be polymer Bragg gratings 200 that are formed of polymer. The polymer for forming the optical waveguide 100 or the Bragg gratings 200 may include halogen elements and include a functional group hardened by ultrasonic rays or heat.

In addition, one or more Bragg gratings 200 may be formed in a longitudinal direction at a predetermined interval and formed on the clads 110 and 120 or the core 130 of the optical waveguide 100.

In this case, a refractive index of a material for forming the core 130 may be higher than a material for forming the clads 110 and 120 and a refractive index of a material for forming the Bragg gratings 200 may be in the range of a refractive index of a material for forming the core 130 and a refractive index of a material for forming the clads 110 and 120.

A plurality of Bragg gratings 200 are periodically connected in series in a single optical waveguide 100. The Bragg gratings 200 may have independent orders of 1, 3, 5, or 7, and a geometric structure of the optical waveguide 100 may be a rib structure, a ridge structure, an inverted rib structure, an inverted ridge structure, or a channel structure.

The tunable wavelength thin film heater 300 is formed on the optical waveguide including the Bragg gratings 200 and the thin film heater 400 for phase adjustment is formed on the optical waveguide to be spaced apart from the Bragg gratings 200 by a predetermined distance in a length direction.

The tunable wavelength thin film heater 300 and the thin film heater 400 for phase adjustment may be any general metal thin film heater to which power is supplied to generate heat, and in particular, may be a heater including a thin film type heating element selected from the group consisting of chrome (Cr), nickel (Ni), copper (Cu), silver (Ag), gold (Au), platinum (Pt), titanium (Ti), aluminum (Al), and an alloy thereof such as nichrome.

In particular, the thermoelectric cooler 600 may be disposed on a lower surface of the substrate 20 on which the optical waveguide 100, the Bragg gratings 200, and the metal temperature sensor 500 are formed with the same height as each heater 300 or 400 and spaced apart from the tunable wavelength thin film heater 300 in a width direction by a predetermined distance in order to compensate for characteristic change according to change in surrounding temperature of the tunable wavelength thin film heater 300 and the thin film heater 400 for phase adjustment are disposed.

In general, the thermoelectric cooler 600 may be any cooler used for cooling an integrated device or apparatus, and in particular, may be a cooler including a thermoelement. The thermoelectric cooler 600 absorbs heat according to a predetermined electrical signal to perform cooling.

In the present invention configured as described, a reflective wavelength band of the Bragg gratings 200 may be adjusted using a thermo-optic effect caused by the thin film heaters 300 and 400. In this case, heat absorption and heating temperatures of the tunable wavelength thin film heater 300, the thin film heater 400 for phase adjustment, and the thermoelectric cooler 600 may be adjusted based on a temperature measured by the metal temperature sensor 500 for measuring a temperature using a resistance change of a metal thin film so as to adjust a reflective band of the Bragg gratings 200 regardless of the external environment.

In short, the tunable wavelength filter 10 with the embedded metal temperature sensor according to the present invention may include the tunable wavelength thin film heater 300 disposed on the optical waveguide 100 including the Bragg gratings 200 formed therein, include the metal temperature sensor 500 disposed at one side or opposite sides of the tunable wavelength thin film heater 300, and include the thermoelectric cooler 600 below the optical waveguide 100 including the Bragg gratings 200 formed therein, thereby implementing effective and accurate thermo-optic effect.

Figure 5:
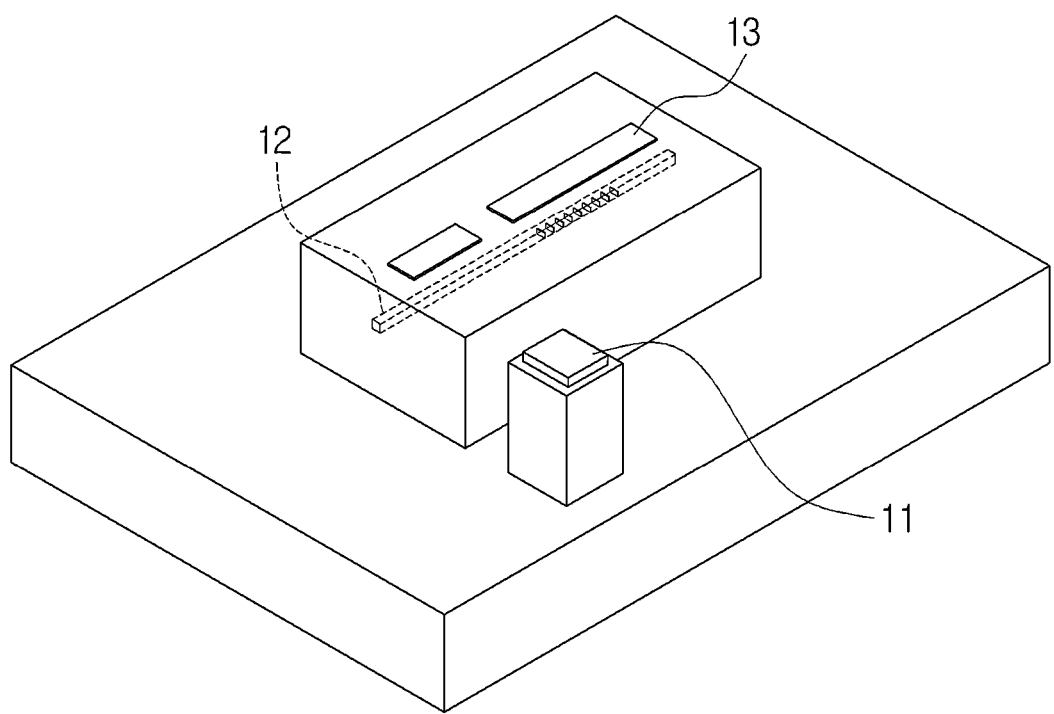
FIG. 5 is a perspective view of a conventional external-cavity type tunable wavelength laser module.

In this case, the metal temperature sensor 500 formed on the optical waveguide 100 may be positioned on an isothermal layer having the same temperature distribution as the core 130 of the optical waveguide 100 (refer to FIG. 5). As such, the problem in which errors occur due to a difference between a conventional location where a temperature is measured and a location of the optical waveguide 100 may be overcome so as to minimize a temperature difference with the optical waveguide 100, and a temperature change of the core 130 of the optical waveguide 100 may be monitored.

In addition, the metal temperature sensor 500 may be disposed at two points positioned on an isothermal layer having the same temperature distribution as the core 130 of the optical waveguide 100, that is, opposite sides of the tunable wavelength thin film heater 300 in a width direction, thereby improving accuracy.

The metal temperature sensor 500 may be fabricated of the same metal as the tunable wavelength thin film heater 300, and thus the metal temperature sensor 500 and the tunable wavelength thin film heater 300 may be simultaneously fabricated during a conventional thin film heater process without additional processes, and a temperature may be adjusted at low cost without an additional thermistor and a thermistor stem (supporting layer).

That is, according to the present invention, a temperature of the polymer Bragg gratings 200 may be stably adjusted using the metal temperature sensor 500 fabricated to be positioned on an isothermal layer having the same temperature distribution as the core 130 of the optical waveguide 100. A temperature may be measured via a resistance change of the metal temperature sensor 500, and current values of the tunable wavelength thin film heater 300, the thin film heater 400 for phase adjustment, and the thermoelectric cooler 600 may be adjusted based on the measured temperature, thereby maximizing the wavelength stability.

Figure 2:
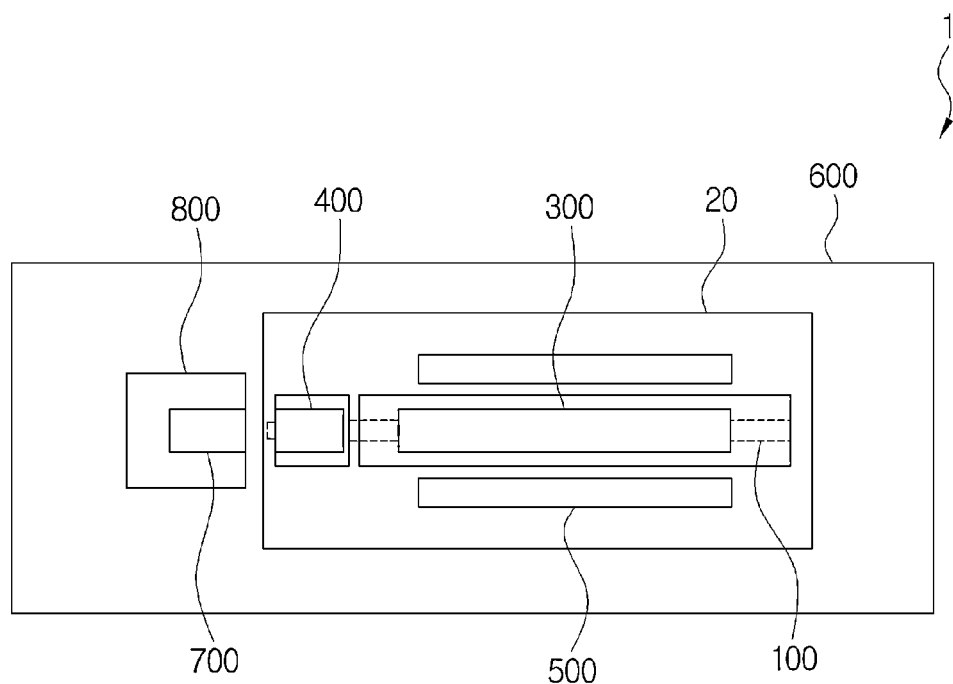
FIG. 2 is a plan view of an external-cavity type tunable wavelength laser module according to the present invention.
Figure 3:
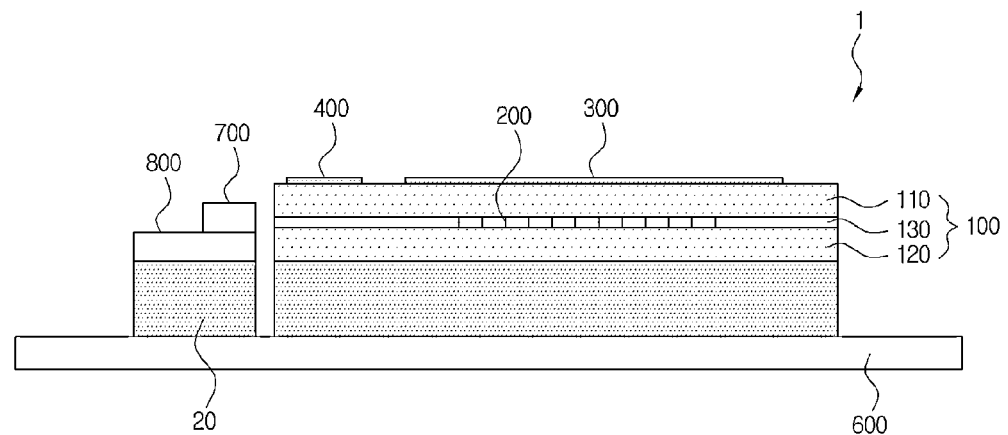
FIG. 3 is a side view of an external-cavity type tunable wavelength laser module according to the present invention.

FIGS. 2 and 3 illustrate an external-cavity type tunable wavelength laser module 1 according to the present invention.

The external-cavity type tunable wavelength laser module 1 using the aforementioned tunable wavelength filter 10 with the embedded metal temperature sensor may use a semiconductor laser chip 700 or a TO-can package type broadband light source including a condensing lens, and the tunable wavelength filter 10 with the embedded metal temperature sensor as an output coupler, may simultaneously use the tunable wavelength thin film heater 300, the thin film heater 400 for phase adjustment, the metal temperature sensor 500, and the thermoelectric cooler 600, and may independently vary a central wavelength of a reflective band with respect to an external environment during a filter operation.

An operating process of the external-cavity type tunable wavelength laser module 1 according to the present invention will now be described in detail. The external-cavity type tunable wavelength laser module 1 according to the present invention may use a method of adjusting a wavelength reflected from the Bragg gratings 200 using a thermo-optic effect of the optical waveguide 100 to adjust a laser output wavelength. In more detail, broadband light emitted from a light source may be input to the core 130 of the optical waveguide 100 via optical coupling and light of a wavelength reflected from the Bragg gratings 200 formed in the optical waveguide 100 may acquire an oscillation wavelength having a central wavelength of a reflective band of the Bragg gratings 200 according to resonance that is re-input to a light emitting surface of the light source.

An effective refractive index of the optical waveguide 100 is changed according to heat generated from the tunable wavelength thin film heater 300 installed on the upper clad 110 of the optical waveguide 100, and thus, a central wavelength of a filter operation is varied.

Then a separate controller (not shown) may be electrically connected to the tunable wavelength thin film heater 300, the metal temperature sensor 500, and the thermoelectric cooler 600 and may adjust heating and heat absorption of the tunable wavelength thin film heater 300 and the thermoelectric cooler 600 based on a temperature input from the metal temperature sensor 500, thereby varying a central wavelength of a laser that is independently oscillated from an external environment.

In addition, the controller may also be electrically connected to the thin film heater 400 for phase adjustment and may perform a function of finely adjusting the length of a tunable wavelength laser cavity by adjusting a temperature of the thin film heater 400 for phase adjustment to adjust a phase of a mode of an oscillating laser. This function minimizes a laser mode hopping effect that mainly affects the wavelength stability of a tunable wavelength laser and is used to improve wavelength stability.

That is, the external-cavity type tunable wavelength laser module according to the present invention may continuously change a wavelength without hopping between modes. In general, since a laser is a cavity, only discontinuous frequencies (or wavelengths) with a predetermined constant interval based on a specific condition oscillate. A wavelength or frequency based on a specific condition may be referred to as a mode and transition between modes may be referred to as hopping. In other words, a phenomenon in which a laser oscillates in any one mode and then jumps into an adjacent mode due to other factors such as a surrounding temperature, etc. may be referred to as mode hopping.

Thus, when a total length of a cavity is adjusted to a desired length using the thin film heater 400 for phase adjustment according to the present invention, it is advantageous in that an interval between modes may be adjusted to prevent hopping and a wavelength may be continuously varied.

In this case, when a distance between the thin film heater 400 for phase adjustment and the tunable wavelength thin film heater 300 used for a tunable wavelength function is short to cause thermal interference, a tunable wavelength function and a safety function affect each other to destabilize laser output. Thus, as shown in FIGS. 1 to 3, the thin film heater 400 for phase adjustment may not be adjacent to the tunable wavelength thin film heater 300.

Figure 4:
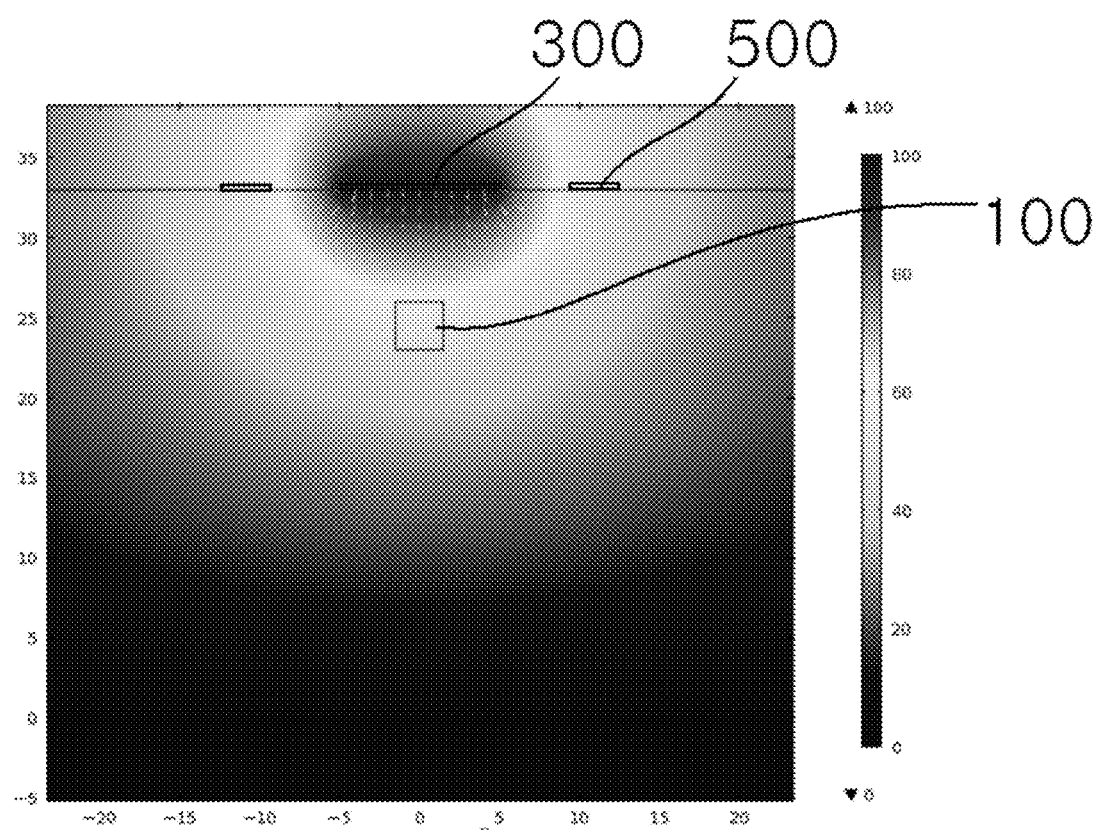
FIG. 4 is a diagram illustrating a temperature distribution isothermal layer in a vertical sectional view of a tunable wavelength filter with an embedded metal temperature sensor according to the present invention.

In particular, according to the present invention, as shown in FIG. 4, the metal temperature sensor 500 and the core 130 of the optical waveguide 100 may be integrated on an isothermal layer having the same temperature distribution as the core 130. Thus, when a thermistor is disposed outside a conventional external-cavity type laser module 1, the problem in which a wavelength is unstable due to a temperature difference between a thermistor and a temperature of the optical waveguide 100, which directly affects a wavelength of a laser may be overcome, thereby maximizing wavelength stability.

In short, the tunable wavelength filter 10 with the embedded metal temperature sensor according to the present invention is advantageous in that the metal temperature sensor 500 is formed at a point on an isothermal layer having the same temperature distribution as the optical waveguide 100 using a resistance change of a metal thin film according to temperature during a process of fabricating the optical waveguide 100 with polymer, and thus, a temperature of the optical waveguide 100 may be accurately measured to achieve wavelength stability.

In addition, it may be advantageous in that the metal temperature sensor 500 and the thin film heater 400 for phase adjustment, the tunable wavelength thin film heater 300 may be formed of the same material and may be simply fabricated using a conventional thin film heater process without an additional process.

In addition, it is advantageous in that the external-cavity type tunable wavelength laser module 1 according to the present invention may use the aforementioned tunable wavelength filter 10 with the embedded metal temperature sensor so as to achieve high productivity during mass production and thermal, electrical, and mechanical stability.

A coding chip stem 800 that has not been described functions as a support layer of the semiconductor laser chip 700.

The present invention is not limited to the aforementioned embodiments, and needless to say, various scopes are possible. For example, the present invention may also be applied to a variable optical attenuator (VOA) for attenuating intensity of an optical signal using a thermo-optic effect such as a tunable wavelength filter directed by the present invention. In addition, it will be understood by those of ordinary skill in the art that various changes in form and details may be made therein without departing from the spirit.

A tunable wavelength filter with embedded metal temperature sensor according to the present invention is advantageous in that a metal temperature sensor using a resistance change of a metal thin film according to temperature is formed at a point on an isothermal layer having the same temperature distribution as an optical waveguide during a process for fabricating an optical waveguide with polymer so as to accurately measure a temperature of the optical waveguide, thereby achieving wavelength stability.

According to the present invention, it is advantageous in that a metal temperature sensor, a thin film heater for phase adjustment, and a tunable wavelength thin film heater may be formed of the same material and thus may be simply fabricated using a conventional thin film heater process without an additional process.

In addition, it is advantageous in that the external-cavity type tunable wavelength laser module according to the present invention may use the aforementioned tunable wavelength filter with the embedded metal temperature sensor so as to achieve high productivity during mass production and thermal, electrical, and mechanical stability.

What is claimed is:
1. A tunable wavelength filter with an embedded metal temperature sensor comprising:
    an optical waveguide;
    one or more Bragg gratings formed on the optical waveguide;

a tunable wavelength thin film heater formed on the optical waveguide comprising the Bragg gratings;

a thin film heater for phase adjustment formed on the optical waveguide and formed to be spaced apart from the Bragg gratings in a length direction by a predetermined distance;

a metal temperature sensor formed on the optical waveguide and formed to be spaced apart from the tunable wavelength thin film heater in a width direction by a predetermined distance; and a thermoelectric cooler disposed on a lower surface of a substrate on which the optical waveguide and the Bragg gratings are formed, wherein the metal temperature sensor is fabricated of the same metal as the tunable wavelength thin film heater.

2. The tunable wavelength filter with the embedded metal temperature sensor of claim 1, wherein the metal temperature sensor is positioned on an isothermal layer having the same temperature distribution as a core of the optical waveguide.

3. The tunable wavelength filter with the embedded metal temperature sensor of claim 2, wherein the metal temperature sensor is formed on each of opposite sides of the tunable wavelength thin film heater in the width direction.

4. The tunable wavelength filter with the embedded metal temperature sensor of claim 2, wherein the metal temperature sensor is fabricated using the same process as the tunable wavelength thin film heater during a fabricating process of the tunable wavelength thin film heater.

5. An external-cavity type tunable wavelength laser module formed to comprise the tunable wavelength filter with the embedded metal temperature sensor of claim 1.

6. An external-cavity type tunable wavelength laser module formed to comprise the tunable wavelength filter with the embedded metal temperature sensor of claim 2.

7. An external-cavity type tunable wavelength laser module formed to comprise the tunable wavelength filter with the embedded metal temperature sensor of claim 3.

8. An external-cavity type tunable wavelength laser module formed to comprise the tunable wavelength filter with the embedded metal temperature sensor of claim 4.

9. The external-cavity type tunable wavelength laser module of claim 5, wherein the tunable wavelength laser module continuously varies a wavelength.

10. The external-cavity type tunable wavelength laser module of claim 6, wherein the tunable wavelength laser module continuously varies a wavelength.

11. The external-cavity type tunable wavelength laser module of claim 7, wherein the tunable wavelength laser module continuously varies a wavelength.

12. The external-cavity type tunable wavelength laser module of claim 8, wherein the tunable wavelength laser module continuously varies a wavelength.

* * * * *